(12) United States Patent
Orsi

(10) Patent No.: US 12,328,117 B2
(45) Date of Patent: Jun. 10, 2025

(54) RETRACTABLE CAPACITIVE SWITCH KIT

(71) Applicant: GRANITIFIANDRE S.P.A., Castellarano (IT)

(72) Inventor: Carlo Orsi, Bologna (IT)

(73) Assignee: GRANITIFIANDRE S.P.A., Castellarano (IT)

( * ) Notice: Subject to any disclaimer, the term of this patent is extended or adjusted under 35 U.S.C. 154(b) by 201 days.

(21) Appl. No.: 18/014,795

(22) PCT Filed: Jul. 2, 2021

(86) PCT No.: PCT/IB2021/055955
§ 371 (c)(1),
(2) Date: Jan. 6, 2023

(87) PCT Pub. No.: WO2022/009045
PCT Pub. Date: Jan. 13, 2022

(65) Prior Publication Data
US 2023/0353148 A1    Nov. 2, 2023

(30) Foreign Application Priority Data
Jul. 6, 2020   (IT) .................. 102020000016225

(51) Int. Cl.
*H03K 17/96* (2006.01)

(52) U.S. Cl.
CPC ............... *H03K 17/9622* (2013.01); *H03K 2217/960755* (2013.01)

(58) Field of Classification Search
CPC ... H03K 17/9622; H03K 2217/960755; H03K 2217/96076; H03K 17/962; H01H 2239/006; H01H 2003/0293
See application file for complete search history.

(56) References Cited

U.S. PATENT DOCUMENTS

| 11,460,874 | B1* | 10/2022 | King | G05F 1/625 |
| 2011/0040419 | A1* | 2/2011 | Kogler | H04L 41/0806 700/286 |
| 2013/0249568 | A1 | 9/2013 | Botten | |

FOREIGN PATENT DOCUMENTS

DE 20004404 U1 7/2001

* cited by examiner

*Primary Examiner* — Ahmed M Saeed
(74) *Attorney, Agent, or Firm* — Dickinson Wright PLLC; Andrew D. Dorisio

(57) ABSTRACT

A retractable capacitive switch kit (10) for an electrical system, comprising a switch block or assembly (12) placed in a partition of a wall (26) and below a plate (28) covering said wall (26) without externally protruding elements with respect to said plate or covering, communication interface means with a system control/management device and connection means (15) between said switch block or assembly (12) and said communication interface means.

8 Claims, 1 Drawing Sheet

RETRACTABLE CAPACITIVE SWITCH KIT

TECHNICAL FIELD

The present invention relates to a retractable capacitive switch kit.

BACKGROUND

More in particular, the present invention relates to a kit for a switch of an electrical system suitable for switching on/off lights or for enabling the opening/closing of shutters or similar systems, with said capacitive-type switch retractable in a wall, furniture or furnishing accessories or furnishing surfaces.

As is known, switches for use in electrical systems of civil or commercial buildings are typically installed on a wall and comprise a boxed element (or rocker) fixed to the surface of a wall or recessed into an opening or recess thereof, with said boxed element comprising the switch block defined by the electronics, connections to the electrical system and actuation elements (button or knob or the like) for establishing or interrupting the electrical continuity of the electrical circuit.

Traditionally, in the case of recessed switches, the boxed element containing the switch block is closed by a plate from which only the actuation elements protrude, with said plate and with said actuation elements having shape, material and colour features linked to purely aesthetic needs.

Over the years, with the change in aesthetic trends, an attempt has been made to make the actuation element more uniform with the switch block and, in particular, with the plate covering the switch block in order to define a single body seamlessly therewith (in fact, having the actuation elements externally protruding with respect to the covering plate) and, furthermore, with the development of technologies related to home automation (more properly known as domotics), the actuation elements have undergone changes to better adapt to the changed technologies and new trends in aesthetic taste.

Therefore, the traditional switches have been flanked by capacitive-type switches in which the actuation elements are not buttons or knobs actuated by snaps or rotated (for example, to dim or adjust light intensity), but are of the "swipe" or "touch" type and are integrated directly into the plate which closes the switch block and do not protrude with respect thereto; therefore, the switch comprises the switch block and the plate which integrates the actuation element (or the actuation elements) and, furthermore, comprises sensors (arranged in the plate and connected with the switch block) which are activated upon the swiping/touching action of the plate (at the position of the actuation element) detecting the contact of the user's finger on the plate and transmitting the signal to the switch block which commands the lights to be switched on or off or the activation/deactivation of other types of systems.

However, even these types of switches have drawbacks related to the fact that they are devices which, although in some way "camouflaged", are not fully integrated into the structures of the walls and do not define a single body therewith.

In particular, such traditional switches, in the case of walls, are applied to said coverings or, in any case, require processing on such coverings for the application thereof (for example, cutting operations of the covering to form suitable seats to contain the switch or parts thereof).

Therefore, the traditional switches do not completely solve the problems related to aesthetic needs which are increasingly felt today.

SUMMARY

The object of the present invention is to overcome the drawbacks described above.

More in particular, the object of the present invention is to provide a retractable capacitive switch kit integrated in a wall.

A further object of the present invention is to provide a capacitive switch kit which is completely retractable and has no elements which are externally protruding or visible with respect to the wall and with respect to a covering thereof.

A further object of the present invention is to provide a retractable capacitive switch kit which does not necessarily require processing (except where or when required) of or on wall coverings or other type of covering or furniture at which the retractable switch is applied.

A further object of the present invention, as a consequence of the fact that it is not necessary to perform processing on the coverings, is represented by defining reduced installation times of the materials with a consequent reduction of the related costs.

A further object of the present invention is to provide users with a capacitive switch kit of high reliability and duration over time and such as, furthermore, to be easily and economically made.

These and other objects are achieved by the invention having the features according to claim 1.

According to the invention, a retractable capacitive switch kit for an electrical system is provided, comprising a switch block or assembly placed in a seat formed in a partition of a wall and below a plate covering said wall without externally protruding elements with respect to said plate, communication interface means with a system control/management device and connection means between said switch block or assembly and said communication interface means.

Advantageous embodiments of the invention appear from the dependent claims.

BRIEF DESCRIPTION OF THE DRAWINGS

The constructive and functional features of the retractable capacitive switch kit of the present invention can be better understood from the following detailed description, in which reference is made to the attached drawings which represent a non-limiting embodiment provided solely as a preferred, non-limiting example, in which.

DETAILED DESCRIPTION

Figure 1:
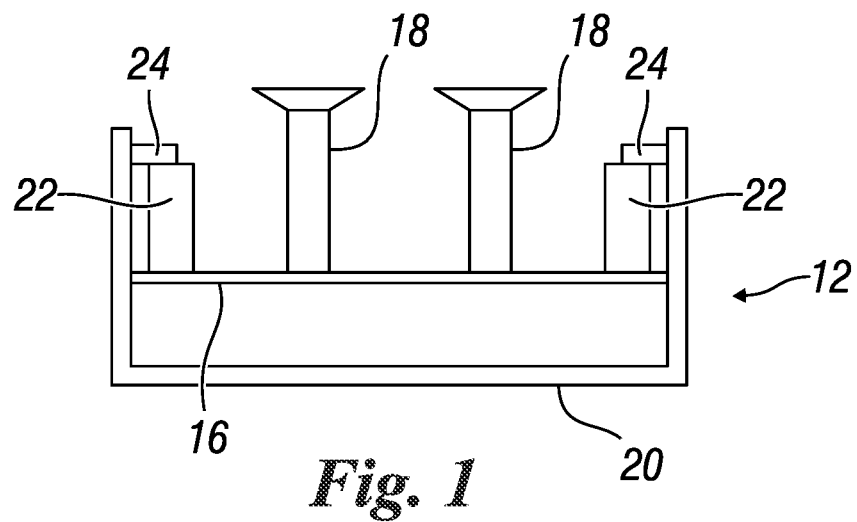
FIG. 1 schematically illustrates a front view of the retractable capacitive switch kit of the present invention.

With reference to the aforementioned figures, the retractable capacitive switch kit of the present invention, indicated overall with 10 in the aforementioned figures, comprises a switch block or assembly 12, communication interface means defined by an electronic interface device 14 of based on KNX protocol type (or KONNEX interface) and connection means 15 between said switch block or assembly 12 and electronic interface 14.

The switch block or assembly 12 comprises an electronic board 16 (a printed circuit board or PCB) on which the electrical and electronic components necessary for the operation of the switch of the kit of the invention are arranged, for the connection with the electronic interface 14 of KNX type and for the connection of switch actuation/detection elements stabilized to the board, with said switch block or assembly further comprising housing means for said board. The actuation/detection elements of the switch comprise at least one capacitive detection element 18 defined by an elastic means of the helical spring type whose operation will be better described below (in the embodiment of the figures, there are two capacitive detection means and the number thereof is chosen according to the specific needs (for example, depending on the devices to be controlled by means of the switch)); said elastic element defined by the helical spring, in accordance with the embodiment of the figures, is stabilized with one end at the electronic board 16 and has the opposite free end for the function better described below.

The electronic board 16 is arranged inside a container element 20 defined by a standard junction box and is stabilized to said container element 20, preferably, by spacers 22 and support tabs 24; the container element 20, as better described below, is adapted to be installed in a suitable and dedicated seat obtained in the partition of a wall or inserted in cavities (for example in the case of plasterboard walls or similar panels).

The electronic interface 14 of KNX type puts the switch in communication with system control/management devices defined, for example, by a control unit or by a computer for programming, diagnostics, control and other related operations of a home automation system (not shown in the figure) of the electrical system to which the switch refers, said electronic interface is not installed on the electronic board 16 (and therefore is not inserted inside the container element 20), but is placed in a remote position with respect to said electronic board and is connected thereto through a connection cable 15 defined by a multi-wire strap.

Figure 2:
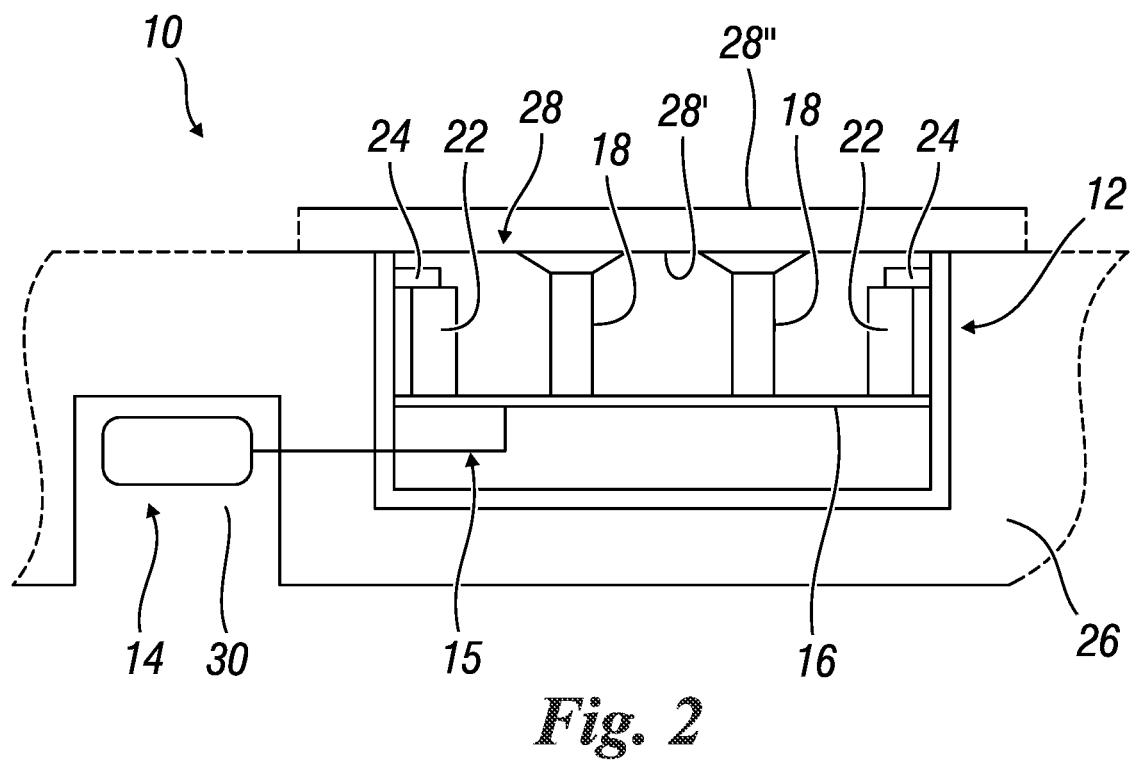
FIG. 2 schematically illustrates the retractable capacitive switch kit of the present invention during installation.

With reference to FIG. 2, the installation of the retractable switch kit of the invention is illustrated.

In particular, the container element 20 of the switch block or assembly 12 is inserted in a suitable and dedicated seat obtained in the partition of a wall 26 (or on the inner surface of a plasterboard plate) and stabilized therein with retaining means of a known type, with said wall 26 (and, therefore, with the seat obtained in said wall) covered by means of a plate 28 of porcelain stoneware, marble or other similar and known stone material or other suitable covering material.

More in particular, when the plate 28 is placed to cover the wall 26, the at least one capacitive detection element 18 is in contact with an inner front 28' of the plate 28 opposite an outer front 28" (the free end of the elastic element defined by the helical spring opposite the fixed end with respect to the electronic board is placed in contact with the inner front of said plate); the plate 28 completely covers the switch block or assembly 12 without making any element of the same externally protrude and does not have any opening or seat which makes elements of the switch protrude (the plate 28 at the switch can have indicators of the capacitive area below, with said indicators which can be defined by graphic elements obtained by screen printing or stamping or by adhesive elements applied or the like, or, such indicators can be defined and made by means of mechanical processes such as, for example, drilling holes or the like on said plate to define the keys for the activation/deactivation of the functions for which the switch is set).

The electronic interface 14 is arranged in a remote position with respect to the switch block or assembly 12 and is, for example, inserted in a dedicated seat 30 formed in the partition of a wall at a location easily inspectable by a user in case of need (maintenance, failure, replacement and the like); said interface is then placed in connection with a control unit (not shown in the figure) or with a computer which manages the signals coming from the switch block or assembly and the signals coming from other devices (in the case of a home automation type system).

As described above, the connection between the electronic interface 14 and the switch block or assembly 12 is made by means of the connection cable 15 of which, preferably, only the wires at the ends of the multi-wire strap of the connection cable are used (this in order to keep the antennas separate, avoiding interference in operation).

During use and in order to activate/deactivate the device to which the switch is connected (the lighting system of a room, shutters, a single curtain or similar devices), the user will touch (or more precisely "swipe") the surface of the plate at the switch and this touch will be detected at the actuation/detection element which, through the electronic board and the connection means, will transmit the touch signal to the electronic interface 14 which, communicating with the control unit/computer, will enable/disable the corresponding device.

In accordance with an alternative embodiment, the capacitive switch kit described above can be associated with a remote server (for example, housed in the control unit/computer with which the electronic interface 14 communicates or defined by an accessory element in communication with said electronic interface 14 and with the control unit/computer) functional to establish a communication with a device such as a smartphone or tablet, mobile phone or the like to define a possibility of remote command and control of the operation of the above-described retractable capacitive switch by means of a dedicated software or application installed on said mobile phone or tablet or the like.

As can be seen from the above, the advantages obtained by the device or kit of the invention are clear.

The retractable capacitive switch kit of the present invention advantageously allows to install a completely retractable switch in a wall without externally protruding or visible elements with respect to the wall or a covering thereof.

A further advantage of the switch of the invention is that it does not necessarily require additional machining on the plates placed on the covering (for example, the creation of openings therein with cutting processes) and, therefore, allows to create uniform and homogeneous surfaces with a high aesthetic connotation.

Further advantageous is the fact that the switch of the invention is easy to install.

Furthermore, it is advantageous that the electronic interface, not being fixed directly to the body of the switch block or assembly, but being arranged in a remote position with respect thereto, can be arranged in a comfortable and easy place and such as to make inspection and maintenance operations simple without the need to remove materials already laid or installed such as, for example, the covering plates.

Furthermore, it is advantageous that the detection elements of the capacitive type defined by the springs do not require maintenance or software updates and this consequently leads to a reduction in costs and an increase in the life of the switch itself.

Although the invention has been described above with particular reference to an embodiment given merely by way of non-limiting example, numerous modifications and variations will be apparent to a person skilled in the art in the light of the above description. Therefore, the present invention intends to embrace all the modifications and variations which fall within the scope of the following claims.

The invention claimed is:

1. A retractable capacitive switch kit (10) for an electrical system, comprising:
   a switch block or assembly (12) placed in a partition of a wall (26) and below a plate (28) covering said wall (26) or inside furniture or other furnishing coverings/surfaces without externally protruding elements with respect to said plate or covering, comprising communication interface means with a system control/management device arranged in a dedicated seat (30) formed in the partition of a wall (26) in a position that can be inspected by a user and remotely or indirectly in contact with the switch block or assembly (12) and placed in connection with a control unit or with a computer and connection means (15) between said switch block or assembly (12) and said communication interface means, with the switch block or assembly (12) including a container element (20) with an electronic board (16) and switch actuation/detection elements positioned inside; and
   one or more capacitive detection elements housed within the container element of the switch block or assembly,
   wherein the dedicated seat is external to the container element such that the connection means is configured to pass through the partition of the wall to connect to the communication interface means arranged in the dedicated seat, and
   wherein the communication interface means comprises a KNX protocol (KONNEX communication protocol) electronic interface (14).

2. The kit according to claim 1, characterized in that the switch actuation/detection elements comprise at least one capacitive detection element (18) stabilized to the electronic board (16).

3. The kit according to claim 2, characterized in that the at least one capacitive detection element (18) comprises an elastic element defined by a helical spring in contact with an inner front (28') of the plate (28) opposite an outer front (28") when the switch block or assembly (12) is operably installed in the partition of the wall (26).

4. The kit according to claim 1, characterized in that the container element (20) comprises a junction box in which the electronic board (16) is stabilized by spacers (22) and support tabs (24).

5. The kit according to claim 1, characterized in that the connection means (15) between said switch block or assembly (12) and said communication interface means comprise a connection cable (15) defined by a multi-wire strap.

6. The kit according to claim 1, characterized in that the kit comprises a remote server for establishing a communication with a computing device to define a remote command and control possibility of the capacitive switch.

7. The kit according to claim 1, characterized in that at the switch, the plate (28) comprises indicators of an underlying capacitive area, said indicators being defined by graphic elements obtained by at least one of screen printing, stamping, and applied adhesive elements, or being defined and obtained by means of a drilling-type machining on said plate.

8. The kit according to claim 1, wherein (i) the one or more capacitive elements are configured to protrude from the container element when the plate is not installed over the container element and (ii) the one or more capacitive elements do not protrude from the container element when the plate is installed over the container element.

* * * * *